US011203069B2

(12) United States Patent
Morjan Brenning et al.

(10) Patent No.: US 11,203,069 B2
(45) Date of Patent: Dec. 21, 2021

(54) CVD COATED CUTTING TOOL

(71) Applicant: SANDVIK INTELLECTUAL PROPERTY AB, Sandviken (SE)

(72) Inventors: Raluca Morjan Brenning, Uppsala (SE); Jan Engqvist, Uppsala (SE); Erik Lindahl, Knivsta (SE); Ernesto Coronel, Uppsala (SE)

(73) Assignee: Sandvik Intellectual Property AB, Sandviken (SE)

( * ) Notice: Subject to any disclaimer, the term of this patent is extended or adjusted under 35 U.S.C. 154(b) by 433 days.

(21) Appl. No.: 16/311,013

(22) PCT Filed: Jun. 20, 2017

(86) PCT No.: PCT/EP2017/065021
§ 371 (c)(1),
(2) Date: Dec. 18, 2018

(87) PCT Pub. No.: WO2017/220536
PCT Pub. Date: Dec. 28, 2017

(65) Prior Publication Data
US 2020/0308707 A1    Oct. 1, 2020

(30) Foreign Application Priority Data
Jun. 21, 2016   (EP) .................................... 16175516

(51) Int. Cl.
*B32B 27/14* (2006.01)
*B23B 27/14* (2006.01)
(Continued)

(52) U.S. Cl.
CPC ............. *B23B 27/148* (2013.01); *B23C 3/00* (2013.01); *B23C 5/20* (2013.01); *B26D 1/0006* (2013.01);
(Continued)

(58) Field of Classification Search
CPC ....... B23B 27/14; B23B 27/148; C23C 16/32; C23C 16/34; C23C 16/36; C23C 16/403
(Continued)

(56) References Cited

U.S. PATENT DOCUMENTS

2006/0003187 A1* 1/2006 Osada ................. C23C 30/005
428/698
2006/0035111 A1* 2/2006 Osada ................. C23C 16/32
428/698

(Continued)

FOREIGN PATENT DOCUMENTS

EP   1905870 A2   4/2008
EP   2604720 A1   6/2013

*Primary Examiner* — Archene A Turner
(74) *Attorney, Agent, or Firm* — Corinne R. Gorski

(57) ABSTRACT

A coated cutting tool for chip forming machining of metals includes a substrate having a surface coated with a chemical vapour deposition (CVD) coating. The substrate is coated with a coating having a layer of $\alpha\text{-}Al_2O_3$, wherein the $\alpha\text{-}Al_2O_3$ layer exhibits a texture coefficient $TC(0\ 0\ 12) \geq 7.2$ and wherein the ratio of $I(0\ 0\ 12)/I(0\ 1\ 14) \geq 0.8$. The coating further includes a MTCVD TiCN layer located between the substrate and the $\alpha\text{-}Al_2O_3$ layer. The MTCVD TiCN layer exhibits a pole figure, as measured by EBSD, in a portion of the MTCVD TiCN layer parallel to the outer surface of the coating and less than 1 μm from the outer surface of the MTCVD TiCN, wherein a pole plot based on the data of the pole figure, with a bin size of 0.25° over a tilt angle range of $0° \leq \beta \leq 45°$ from the normal of the outer surface of the coating shows a ratio of intensity within $\beta \leq 15°$ tilt angle to the intensity within $0° \leq \beta \leq 45°$ of $\geq 45\%$.

10 Claims, 4 Drawing Sheets

(51) Int. Cl.
*B23C 3/00* (2006.01)
*B26D 1/00* (2006.01)
*C23C 16/30* (2006.01)
*C23C 16/36* (2006.01)
*C23C 16/40* (2006.01)
*C23C 28/04* (2006.01)
*B23C 5/20* (2006.01)

(52) U.S. Cl.
CPC ............ *C23C 16/303* (2013.01); *C23C 16/36* (2013.01); *C23C 16/403* (2013.01); *C23C 28/042* (2013.01); *C23C 28/044* (2013.01); *B23C 2200/36* (2013.01); *B23C 2210/50* (2013.01); *B23C 2224/04* (2013.01); *B23C 2224/32* (2013.01); *B23C 2228/04* (2013.01); *B26D 2001/002* (2013.01)

(58) Field of Classification Search
USPC .......... 428/336, 698, 701, 702; 51/307, 309
See application file for complete search history.

(56) References Cited

U.S. PATENT DOCUMENTS

| | | |
|---|---|---|
| 2014/0173996 A1 | 6/2014 | Stiens et al. |
| 2014/0193624 A1 | 7/2014 | Stiens et al. |
| 2016/0136786 A1 | 5/2016 | Bjormander |
| 2016/0175940 A1* | 6/2016 | Lindahl ................ C23C 28/044 428/141 |

* cited by examiner

CVD COATED CUTTING TOOL

RELATED APPLICATION DATA

This application is a §371 National Stage Application of PCT International Application No. PCT/EP2017/065021 filed Jun. 20, 2017 claiming priority to EP 16175516.0 filed Jun. 21, 2016.

TECHNICAL FIELD

The present invention relates to a coated cutting tool for chip forming machining of metals comprising a substrate having a surface coated with a chemical vapour deposition (CVD) coating. The coated cutting tool in accordance with the present invention is particularly useful in applications with high demands of abrasive wear resistance in for example milling, turning or drilling of a metallic material such as alloyed steel, carbon steel or tough hardened steel.

BACKGROUND ART

Chemical Vapour Deposition (CVD) of wear resistant coatings on cemented carbide cutting tools has been in industrial practice for many years. Coatings such as TiCN and $Al_2O_3$ have shown to improve the wear resistance on cutting inserts in cutting of many different materials. A combination on an inner layer of TiCN and an outer layer of $\alpha$-$Al_2O_3$ can be found on many commercial cutting inserts designed for milling or turning of, for example, steel.

EP1905870A2 discloses a coated cutting insert comprising a coating with at least one $\alpha$-$Al_2O_3$ layer showing a strong growth texture along the <0 0 1> direction. The edge toughness of the insert was improved in turning.

OBJECT OF THE INVENTION

It is an object of the invention to provide an alumina coated cutting tool insert with improved performance in cutting operations. It is a further object of the invention to provide a coated cutting tool with improved wear resistance, for example a higher resistance to crater wear, resistance to flaking of coating at plastic deformation of cutting edge, resistance to thermal cracks in lubricated or unlubricated cutting and/or enhanced edge line toughness. Another object of the invention is to provide a cutting tool with high performance in milling, such as milling of steel, alloyed steels, carbon steels and tough hardened steels.

DESCRIPTION OF THE INVENTION

The cutting tool in accordance with the present invention comprises a substrate coated with a coating comprising a layer of $\alpha$-$Al_2O_3$, wherein the thickness of the $\alpha$-$Al_2O_3$ layer is 2-4 μm and wherein the $\alpha$-$Al_2O_3$ exhibits a texture coefficient TC(hkl), as measured by X-ray diffraction using CuK$\alpha$ radiation and 0-2$\theta$ scan, defined according to Harris formula $$TC(hkl) = \frac{I(hkl)}{I_0(hkl)} \left[ \frac{1}{n} \sum_{n=1}^{n} \frac{I(hkl)}{I_0(hkl)} \right]^{-1} \quad (1)$$

where I(hkl) is the measured intensity (integrated area) of the (hkl) reflection, $I_0$(hkl) is the standard intensity according to ICDD's PDF-card No. 00-010-0173, n is the number of reflections used in the calculation, and where the (hkl) reflections used are (1 0 4), (1 1 0), (1 1 3), (0 2 4), (1 1 6), (2 1 4), (3 0 0) and (0 0 12) wherein TC(0 0 12)≥7.2, preferably ≥7.4, more preferably ≥7.5, more preferably ≥7.6, most preferably ≥7.7, and preferably ≤8 and wherein the ratio of I(0 0 12)/I(0 1 14)≥0.8, or ≥1, preferably ≥1.5, more preferably ≥1.7, most preferably ≥2, wherein I(0 0 12) is the measured intensity (integrated area) of the 0 0 12 reflection and I(0 1 14) is the measured intensity (integrated area) of the 0 1 14 reflection.

The coating of the present invention further comprises an MTCVD TiCN layer located between the substrate and the $\alpha$-$Al_2O_3$ layer wherein the thickness of said MTCVD TiCN layer is 2-3 μm. The grains of the MTCVD TiCN layer are columnar.

The MTCVD TiCN layer exhibits a {211} pole figure as measured by EBSD in a portion of the MTCVD TiCN layer parallel to the outer surface of the coating and less than 1 μm, preferably less than 0.5 μm, from the outer surface of the MTCVD TiCN, wherein a pole plot based on the data of the pole figure, with a bin size of 0.25° over a tilt angle range of 0°≤β≤45° from the normal of the outer surface of the coating shows a ratio of intensity within β≤15° tilt angle to the intensity within 0°≤β≤45° of ≥45%.

In one embodiment the MTCVD TiCN layer exhibits a {110} pole figure as measured by EBSD in the same portion of the MTCVD TiCN as defined above, wherein a pole plot based on the data of the pole figure, with a bin size of 0.25° over a tilt angle range of 0°≤β≤45° from the normal of the outer surface of the coating shows a ratio of intensity within β≤15° tilt angle to the intensity within 0°≤β≤45° of ≤30%.

The pole figure and pole plot of the MTCVD TiCN layer are from the portion of the layer that is close to the $\alpha$-$Al_2O_3$ layer. The pole figure and the pole plot are from within 1 μm, preferably from less than 0.5 μm, from the outer surface of the MTCVD TiCN layer which is close to the $\alpha$-$Al_2O_3$ layer.

This MTCVD TiCN layer has shown advantageous in that the wear resistance of the final cutting tool can be improved in several aspects as shown in the milling cutting tests presented below. The cutting tool of the present invention showed higher resistance to crater wear, higher resistance to flaking of coating at plastic deformation of cutting edge, higher resistance to thermal cracks in lubricated and unlubricated cutting and enhanced edge line toughness. It has been realized that the texture of the outer portion of the MTCVD TiCN layer is of high importance for the tool life of the cutting tool, and that a texture measurement with XRD, which presents information from the whole layer, is not sufficient to disclose the improved properties of the present MTCVD TiCN layer. Instead EBSD measurements in a portion of the MTCVD TiCN layer coating close to the $\alpha$-$Al_2O_3$ layer are defined.

The $\alpha$-$Al_2O_3$ layer is typically deposited with thermal CVD. Alternatively other CVD deposition processes can be used. This is also the case for any further layers of the coating as disclosed below. HTCVD is herein defined as a CVD process within the temperature range 950-1050° C., and MTCVD within 800-950° C.

The $\alpha$-$Al_2O_3$ layer is covering at least the area of the cutting tool that is engaged in cutting in a cutting operation, covering at least the areas exposed for crater wear and/or flank wear. Alternatively the whole cutting tool can be coated with the $\alpha$-$Al_2O_3$ layer and/or with any further layers of the coating.

A strong <0 0 1> texture is herein meant as a statistically preferred growth with the α-Al$_2$O$_3$ (0 0 1) crystallographic plane parallel to the substrate surface more frequently than with other crystallographic planes parallel to the substrate surface. A means to express preferred texture is to calculate a texture coefficient TC (h k l) calculated using the Harris formula (formula (1) above) on the basis of a defined set of XRD reflections measured on the respective sample. The intensities of the XRD reflections are standardized using a JCPDF-card indicating the intensities of the XRD reflections of the same material, e. g. α-Al$_2$O$_3$, but with random orientation, such as in a powder of the material. A texture coefficient TC (h k l)>1 of a layer of crystalline material is an indication that the grains of the crystalline material are oriented with their (h k l) crystallographic plane parallel to the substrate surface more frequently than in a random distribution. The texture coefficient TC (0 0 12) is used herein to indicate preferred crystal growth along the <0 0 1> crystallographic direction. The (0 0 1) crystallographic plane is parallel to the (0 0 6) and (0 0 12) crystallographic planes in the α-Al$_2$O$_3$ crystallographic system.

In one embodiment of the present invention the thickness of the α-Al$_2$O$_3$ layer is 2-4 μm, preferably 2.5-3.5 μm.

By MTCVD TiCN is herein meant a Ti($C_x$,Ni$_{1-x}$) wherein 0.2≤x≤0.8, preferably 0.3≤x≤0.7, more preferably 0.4≤x≤0.6. The C/(C+N) ratio of the MTCVD TiCN can for example be measured with an electron micro probe analysis.

In one embodiment of the present invention the coating further comprises a bonding layer comprising a HTCVD deposited TiN, TiCN, TiCNO and/or TiCO or a combination thereof, preferably HTCVD TiCN and TiCNO, located outermost of the MTCVD TiCN layer and adjacent to the α-Al$_2$O$_3$ layer. The bonding layer is to enhance the adhesion between the MTCVD TiCN layer and the α-Al$_2$O$_3$ layer. The bonding layer is preferably oxidized prior to the α-Al$_2$O$_3$ layer deposition. The bonding layer comprises non-columnar grains, for example equally axed grains. The thickness of said bonding layer is preferably 0.5-2 μm, 0.5-1.5 or 0.5-1 μm. The thickness of the bonding layer can for example be measured from a SEM image of the cross section of the coating.

In one embodiment of the present invention the coating comprises a 2-3 μm MTCVD TiCN and a 2-4 μm α-Al$_2$O$_3$ layer. A bonding layer of this embodiment is preferably 0.5-1 μm.

In one embodiment of the present invention the coating comprises an innermost TiN layer, preferably 0.3-0.6 μm in thickness. The TiN layer is preferably located adjacent to the substrate.

In one embodiment of the present invention the substrate is cemented carbide, cermet or ceramic. These substrates have hardness and toughness that suit the coating of the present invention.

In one embodiment of the present invention the substrate of the coated cutting tool consists of cemented carbide comprising 8-15 wt % Co, preferably 8.5-14.5 wt % Co, optionally 0.5-3 wt % cubic carbides, nitrides or carbonitrides of metals from groups IVb, Vb and VIb of the periodic table, preferably Nb, Ta, Cr or combinations thereof, and balance WC. This embodiment may be a milling insert.

In one embodiment of the present invention the α-Al$_2$O$_3$ layer is the outermost layer of the coating. Alternatively, one or more further layers can cover the α-Al$_2$O$_3$ layer, such as layers of TiN, TiC, Al$_2$O$_3$ and/or combinations thereof. In one embodiment of the present invention the one or more further layers covering the α-Al$_2$O$_3$ layer is/are removed from the flank face or the rake face or the cutting edge or combinations thereof.

In one embodiment of the present invention the coating is post treated by blasting or brushing to release tensile stresses of the CVD coated layers and to reduce the surface roughness.

In one embodiment of the present invention the cutting tool is a milling insert.

The present invention also related to the use of a coated cutting tool as disclosed herein in a milling operation of for example steel, preferably of alloyed steel, carbon steel or tough hardened steel. Said cutting tools have shown specifically enhanced performance in crater and flank wear demanding operations, in resistance against flaking at plastic deformation of the cutting edge and in resistance against the formation of thermal cracks.

Methods

CVD Coating Deposition

The CVD coatings in the examples below were deposited in a radial Ion bond type CVD equipment 530 size capable of housing 10000 half-inch size cutting inserts.

X-Ray Diffraction Measurements

In order to investigate the texture of the layer(s) X-ray diffraction was conducted on the flank face using a PANalytical CubiX3 diffractometer equipped with a PIXcel detector. The coated cutting tools were mounted in sample holders to ensure that the flank face of the samples are parallel to the reference surface of the sample holder and also that the flank face is at appropriate height. Cu-Kα radiation was used for the measurements, with a voltage of 45 kV and a current of 40 mA. Anti-scatter slit of ½ degree and divergence slit of ¼ degree were used. The diffracted intensity from the coated cutting tool was measured in the range 20° to 140° 2θ, i.e. over an incident angle θ range from 10 to 70°.

The data analysis, including background subtraction, Cu—K$_{α2}$ stripping and profile fitting of the data, was done using PANalytical's X'Pert HighScore Plus software. The output (integrated peak areas for the profile fitted curve) from this program were then used to calculate the texture coefficients of the layer by comparing the ratio of the measured intensity data to the standard intensity data according to a PDF-card of the specific layer (such as a layer of TiCN or α-Al$_2$O$_3$), using the Harris formula (1) as disclosed above. Since the layer was a finitely thick film the relative intensities of a pair of peaks at different 2θ angles are different than they are for bulk samples, due to the differences in path length through the layer. Therefore, thin film correction was applied to the extracted integrated peak area intensities for the profile fitted curve, taken into account also the linear absorption coefficient of layer, when calculating the TC values. Since possible further layers above for example the α-Al$_2$O$_3$ layer will affect the X-ray intensities entering the α-Al$_2$O$_3$ layer and exiting the whole coating, corrections need to be made for these as well, taken into account the linear absorption coefficient for the respective compound in a layer. The same applies for X-ray diffraction measurements of a TiCN layer if the TiCN layer is located below for example an α-Al$_2$O$_3$ layer. Alternatively, a further layer, such as TiN, above an alumina layer can be removed by a method that does not substantially influence the XRD measurement results, e.g. chemical etching.

In order to investigate the texture of the α-Al$_2$O$_3$ layer X-ray diffraction was conducted using CuK$_α$ radiation and texture coefficients TC (hkl) for different growth directions of the columnar grains of the α-Al$_2$O$_3$ layer were calculated according to Harris formula (1) as disclosed above, where I(hkl)=measured (integrated area) intensity of the (hkl) reflection, $I_0$(hkl)=standard intensity according to ICDD's PDF-card no 00-010-0173, n=number of reflections to be used in the calculation. In this case the (hkl) reflections used are: (1 0 4), (1 1 0), (1 1 3), (0 2 4), (1 1 6), (2 1 4), (3 0 0) and (0 0 12). In the calculation of the ratio I(0 0 12)/I(0 1 14) the integrated peak area intensity of the (0 0 12) peak and the (0 1 14) peak were divided, independently of any PDF-card. The measured integrated peak area is thin film corrected and corrected for any further layers above (i.e. on top of) the $\alpha$-$Al_2O_3$ layer before said ratio is calculated.

The texture coefficients TC (hkl) for different growth directions of the columnar grains of the TiCN layer were calculated according to Harris formula (1) as disclosed earlier, where I(hkl) is the measured (integrated area) intensity of the (hkl) reflection, $I_0$(hkl) is the standard intensity according to ICDD's PDF-card no 42-1489, n is the number of reflections to be used in the calculation. In this case the (hkl) reflections used are (1 1 1), (2 0 0), (2 2 0), (3 1 1), (3 3 1), (4 2 0) and (4 2 2).

It is to be noted that peak overlap is a phenomenon that can occur in X-ray diffraction analysis of coatings comprising for example several crystalline layers and/or that are deposited on a substrate comprising crystalline phases, and this has to be considered and compensated for by the skilled person. A peak overlap of peaks from the $\alpha$-$Al_2O_3$ layer with peaks from the TiCN layer might influence measurement and needs to be considered. It is also to be noted that for example WC in the substrate can have diffraction peaks close to the relevant peaks of the present invention.

EBSD Measurement

Surfaces of the coated inserts were prepared for electron backscatter diffraction (EBSD) characterization by polishing the coating surface using a Gatan Inc. Dimple Grinder model 656 with a 20 mm felt wheel, applying 20 grams of weight and using Buehlers polishing suspension named "Master Polish 2". The polishing was performed just until sufficiently large and smooth surfaces of the MTCVD TiCN coatings were acquired, thus ensuring that the characterized area is from the top part of the MTCVD TiCN coating. The surfaces were immediately cleaned to remove residual polishing suspension and dried with a clean air spray.

The prepared samples were mounted on to a sample holder and inserted into the scanning electron microscope (SEM). The samples were tilted 70° with respect to the horizontal plane and towards the EBSD detector. The SEM used for the characterization was a Zeiss Supra 55 VP operated at 15 kV, using a 60 μm objective aperture, applying "High current" mode and operated in variable pressure (VP) mode at a SEM chamber pressure of 0.128 Torr. The used EBSD detector was an Oxford Instruments Nordlys-Max Detector operated using Oxford Instruments "AZtec" software version 3.1. EBSD data acquisitions were made by applying a focused electron beam on to the polished surfaces and sequentially acquiring EBSD data using a step size of 0.05 μm for 500×300 (X x Y) measuring points. The reference phase used by the "AZtec" software for the data acquisition was: "Electrochem. Soc. [JESOAN], (1950), vol. 97, pages 299-304" and is referred to as "Ti2 C N" in the "AZtec" software.

EXAMPLES

Figure 1:
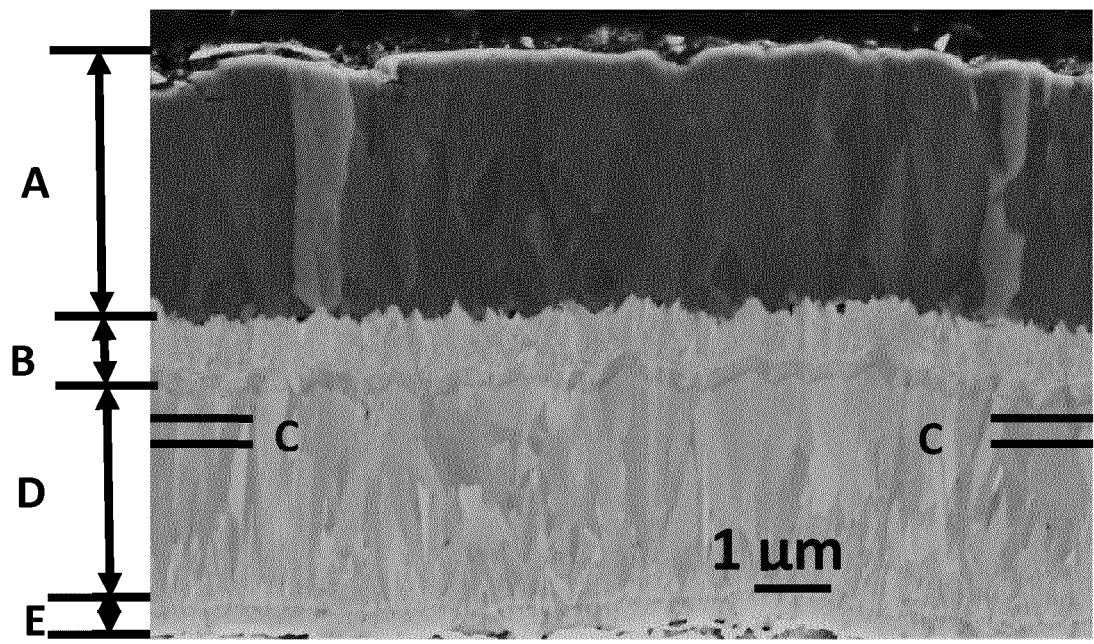
FIG. 1 A SEM image of a cross section of coating C01 according to the invention. The coating comprises a TiN layer (E), a MTCVD TiCN layer (D), a bonding layer (B) and an outermost $\alpha$-alumina layer (A). The portion (C) of the MTCVD TiCN that exhibits the EBSD pole plot is indicated in the figure.

Exemplifying embodiments of the present invention will now be disclosed in more detail and compared to reference embodiments. Coated cutting tools (inserts) were manufactured, analysed and evaluated in a cutting test.

Example 1—Coating Preparation

Coating C01

Inserts with Coromant R390-11T308M-PM, Coromant R245-12T3 M-PM1 and ISO type SNMA 120408 geometry were first coated with a thin approximately 0.4 μm TiN-layer then with an approximately 2.5 μm TiCN layer by employing the well-known MTCVD technique using $TiCl_4$, $CH_3CN$, $N_2$, HCl and $H_2$ at 885° C. The details of the TiN and the TiCN deposition are shown in Table 1.

TABLE 1

| Deposition of MTCVD of TiN and TiCN | | | | | | |
|---|---|---|---|---|---|---|
| MT CVD of TiN and TiCN (885° C.): | Pressure [mbar] | $H_2$ [vol %] | $N_2$ [vol %] | HCl [vol %] | $TiCl_4$ [vol %] | $CH_3CN$ [vol %] |
| TiN | 400 | 48.8 | 48.8 | — | 2.44 | — |
| TiCN inner | 55 | 59 | 37.6 | — | 2.95 | 0.45 |
| TiCN outer | 55 | 81.5 | 7.8 | 7.8 | 2.38 | 0.65 |

Deposition time for TiCN inner and TiCN outer was 10 and 65 minutes, respectively. On top of the MTCVD TiCN layer was a 0.5-1 μm bonding layer deposited at 1000° C. by a process consisting of four separate reaction steps. First a HTCVD TiCN step using $TiCl_4$, $CH_4$, $N_2$, HCl and $H_2$ at 400 mbar, then a second step (TiCNO-1) using $TiCl_4$, $CH_3CN$, CO, $N_2$ and $H_2$ at 70 mbar, then a third step (TiCNO-2) using $TiCl_4$, $CH_3CN$, CO, $N_2$ and $H_2$ at 70 mbar and finally a fourth step (TiCNO-3) using $TiCl_4$, CO, $N_2$ and $H_2$ at 70 mbar. During the third and fourth deposition step some of the gases were continuously changed as indicated by a first start level and a second stop level presented in Table 2. Prior to the start of the subsequent $Al_2O_3$ nucleation, the bonding layer was oxidized for 4 minutes in a mixture of $CO_2$, CO, $N_2$ and $H_2$. The details of the bonding layer deposition are shown in Table 2.

TABLE 2

Bonding layer deposition

| Bonding layer (1000° C.): | Pressure [mbar] | $H_2$ [vol %] | $N_2$ [vol %] | $CH_4$ [vol %] | HCl [vol %] | CO [vol %] | $TiCl_4$ [vol %] | $CH_3CN$ [vol %] | $CO_2$ [vol %] |
|---|---|---|---|---|---|---|---|---|---|
| HTCVD TiCN | 400 | 67.9 | 25.5 | 3.4 | 1.7 | — | 1.56 | — | — |
| TiCNO-1 | 70 | 83.7 | 12 | — | 1.2 | 1.2 | 1.5 | 0.4 | — |
| TiCNO-2 | 70 | 63.1-61.7 | 31.5-30.9 | — | — | 1.6-3.7 | 3.15-3.09 | 0.66-0.64 | — |
| TiCNO-3 | 70 | 62.1-61.5 | 31.1-30.8 | — | — | 3.7-4.6 | 3.11-3.08 | — | — |
| Oxidation | 55 | 53.8 | 30 | — | — | 12.5 | — | — | 3.7 |

On top of the bonding layer an $\alpha$-$Al_2O_3$ layer was deposited. The $\alpha$-$Al_2O_3$ layer was deposited at 1000° C. and 55 mbar in two steps. The first step using 1.2 vol-% $AlCl_3$, 4.7 vol-% $CO_2$, 1.8 vol-% HCl and balance $H_2$ giving about 0.1 μm $\alpha$-$Al_2O_3$ and a second step using 1.2% $AlCl_3$, 4.7% $CO_2$, 2.9% HCl, 0.58% $H_2S$ and balance $H_2$ giving a total $\alpha$-$Al_2O_3$ layer thickness of about 3 μm.

A SEM image of a cross section of the blasted coating C01 is shown in FIG. 1. As seen from the substrate the coating C01 comprises a TiN layer, an MTCVD TiCN layer, i.e. the inner and the outer MTCVD TiCN, a bonding layer, i.e. HTCVD TiCN, TiCNO-1, TiCNO-2, TiCNO-3, and an outermost $\alpha$-$Al_2O_3$ layer. The thicknesses of these layers can for example be studied in an SEM image.

Coating C02

Same type of geometry used as in Coating C01 were first coated with a thin approximately 0.4 μm TiN-layer then with an approximately 1.5 μm TiCN layer by employing the well-known MTCVD technique using $TiCl_4$, $CH_3CN$, $N_2$, HCl and $H_2$ at 885° C. The volume ratio of $TiCl_4$/$CH_3CN$ in an initial part of the MTCVD deposition of the TiCN layer was 6.6, followed by a period using a ratio of $TiCl_4$/$CH_3CN$ of 3.7. The details of the TiN and the TiCN deposition are shown in Table 1.

Deposition time for TiCN inner and TiCN outer was 30 and 10 minutes, respectively. On top of the MTCVD TiCN layer was a 1-2 μm bonding layer deposited at 1000° C. by a process consisting of four separate reaction steps. First a HTCVD TiCN step using $TiCl_4$, $CH_4$, $N_2$, HCl and $H_2$ at 400 mbar, then a second step (TiCNO-1) using $TiCl_4$, $CH_3CN$, CO, $N_2$ and $H_2$ at 70 mbar, then a third step (TiCNO-2) using $TiCl_4$, $CH_3CN$, CO, $N_2$ and $H_2$ at 70 mbar and finally a fourth step (TiCNO-3) using $TiCl_4$, CO, $N_2$ and $H_2$ at 70 mbar. During the third and fourth deposition step some of the gases were continuously changed as indicated by a first start level and a second stop level presented in Table 2. The growth steps time of the bonding layer were doubled as compared to Coating C01. Prior to the start of the subsequent $Al_2O_3$ nucleation, the bonding layer was oxidized for 4 minutes in a mixture of $CO_2$, CO, $N_2$ and $H_2$. The details of the bonding layer deposition are shown in Table 2.

On top of the bonding layer an $\alpha$-$Al_2O_3$ layer was deposited. The $\alpha$-$Al_2O_3$ layer was deposited at 1000° C. and 55 mbar in two steps. The first step using 1.2 vol-% $AlCl_3$, 4.7 vol-% $CO_2$, 1.8 vol-% HCl and balance $H_2$ giving about 0.1 μm $\alpha$-$Al_2O_3$ and a second step using 1.2% $AlCl_3$, 4.7% $CO_2$, 2.9% HCl, 0.58% $H_2S$ and balance $H_2$ giving a total $\alpha$-$Al_2O_3$ layer thickness of about 3 μm.

Coating C03

The coating C03 corresponds to coating C01 but with the difference that the outer TiCN was deposited for 105 minutes instead of 65, and that the $\alpha$-$Al_2O_3$ layer thickness was deposited to about 2 μm.

Coating C04

The coating C04 corresponds to coating C01 but with the difference that the outer TiCN was deposited for 25 minutes instead of 65, and that the $Al_2O_3$ layer thickness was deposited to about 4 μm.

Coating C05

Same type of geometries as for previous coatings were first coated with a thin approximately 0.4 μm TiN-layer, then with an approximately 1.5 μm TiCN layer by employing the well-known MTCVD technique using $TiCl_4$, $CH_3CN$, $N_2$, HCl and $H_2$ at 885° C. The volume ratio of $TiCl_4$/$CH_3CN$ in the MTCVD deposition of the TiCN layer was 2.2. The details of the TiN and the TiCN deposition are shown in Table 3.

TABLE 3

Deposition of TiN and MTCVD of TiCN

| | Temperature [° C.] | Pressure [mbar] | $H_2$ [vol %] | $N_2$ [vol %] | HCl [vol %] | $TiCl_4$ [vol %] | $CH_3CN$ [vol %] |
|---|---|---|---|---|---|---|---|
| TiN | 930 | 160 | 60.1 | 38.3 | — | 1.50 | — |
| TiCN inner | 885 | 55 | 59.8 | 38.05 | — | 1.49 | 0.67 |
| TiCN outer | 885 | 55 | 82.7 | 7.9 | 7.9 | 1.08 | 0.49 |

On top of the MTCVD TiCN layer was a 0.5-1 μm bonding layer deposited at 1010° using 3.03 vol-% $TiCl_4$, 6.06 vol-% CO and 90.1 vol-% $H_2$ at 55 mbar. Prior to the start of the subsequent $Al_2O_3$ nucleation, the bonding layer was oxidized for 2 minutes in a mixture of $H_2$, $CO_2$ and HCl.

On top of the bonding layer an $\alpha$-$Al_2O_3$ layer was deposited. The $\alpha$-$Al_2O_3$ layer was deposited at 1010° C. and 55 mbar in two steps. The first step using 2.3 vol-% $AlCl_3$, 4.6 vol-% $CO_2$, 1.7 vol-% HCl and balance $H_2$ giving about 0.1 μm $\alpha$-$Al_2O_3$ and a second step using 2.2% $AlCl_3$, 4.4% $CO_2$, 5.5% HCl, 0.33% $H_2S$ and balance $H_2$ giving a total $\alpha$-$Al_2O_3$ layer thickness of about 2.7 μm.

Coating C06

The coating C06 corresponds to coating C02 but with the difference that the outer TiCN was deposited for 40 minutes instead of 10 minutes and that the deposition process was stopped after this step.

Example 2—Texture Analysis

The layer thicknesses were analysed in a light optical microscope by studying a cross section of each coating at 1000× magnification. The thicknesses can also be studied in a SEM image. The results are presented in Table 4

XRD was used to analyse the TC values of the $\alpha$-$Al_2O_3$ and the MTCVD TiCN in accordance with the method as disclosed above. The texture analysis was made on coated ISO type SNMA120408 cemented carbide substrates. It is to be noted that the TC(311) of the MTCVD TiCN is disturbed by a WC peak and that this is not corrected for when calculating the TC(220) and TC(422) as presented in the Table 5.

TABLE 4

Layer thicknesses and TC

| Coating | Layer thickness TiN [μm] | Layer thickness MTCVD TiCN [μm] | Layer thickness Bonding layer [μm] | Layer thickness α-Al$_2$O$_3$ [μm] | TC(0 0 12) of α-Al$_2$O$_3$ | I(0 0 12)/ I(0 1 14) of α-Al$_2$O$_3$ |
|---|---|---|---|---|---|---|
| C01 | 0.5 | 2.4 | 0.8 | 3.0 | 7.50 | 1.05 |
| C02 | 0.5 | 1.5 | 1.7 | 3.2 | 4.19 | 0.39 |
| C03 | 0.4 | 3.3 | 0.8 | 2.1 | 7.12 | 1.49 |
| C04 | 0.4 | 1.7 | 0.8 | 3.9 | 7.45 | 0.81 |
| C05 | 0.4 | 1.7 | 0.8 | 2.7 | 0 | 0 |
| C06 | 0.5 | 2.0 | — | — | — | — |

A high TC(0 0 12) is advantageous in providing a high crater wear resistance. The texture of the α-Al$_2$O$_3$ layer is controlled by the process parameters during deposition and is developed with increased layer thickness of the α-Al$_2$O$_3$ layer. The texture of the α-Al$_2$O$_3$ layer is also influenced by the texture of the preceding MTCVD TiCN layer. If the α-Al$_2$O$_3$ layer is too thin its orientation is less pronounced. The C01 and C04 have very high TC(0 0 12) and are also the most crater wear resistant as seen below. The C03 is probably too thin to give this very high TC(0 0 12) value. The references C02 and C05 are deposited on a different TiCN and with a different α-Al$_2$O$_3$ CVD process and do not show high TC(0 0 12) values.

TABLE 5

Texture coefficients for MTCVD TiCN

| Coating | TC(220) | TC(422) |
|---|---|---|
| C01 | 0.56 | 1.96 |
| C02 | 0.71 | 0.95 |
| C03 | 0.46 | 2.36 |
| C04 | 0.75 | 0.78 |
| C05 | 1.76 | 0.47 |
| C06 | 1.05 | 1.06 |

It can be noted from the TC values of the MTCVD TiCN that both the TC(422) and the TC(220) are relatively low. It can also be noted that the thicker the MTCVD TiCN the higher the TC(422) and the lower TC(220) values when comparing C04 (1.7 μm), C01 (2 μm) and C03 (3.3 μm) that were deposited with the corresponding MTCVD TiCN processes.

Pole figures were measured by EBSD in a portion of the MTCVD TiCN layer parallel to the outer surface of the coating and less than 1 μm from the outer surface of the MTCVD TiCN of coatings C01, C02, C03, C04 and C06. For this measurement the coatings C01 and C06 were provided with the MTCVD layer being the outermost layer, while the outer layers of the coatings C02, C03 and C04 were removed by polishing with said Dimple Grinder as disclosed above before the measurement. Any outer layer can be removed by the skilled person prior to any EBSD analysis, for example by grinding and polishing.

Figure 3:
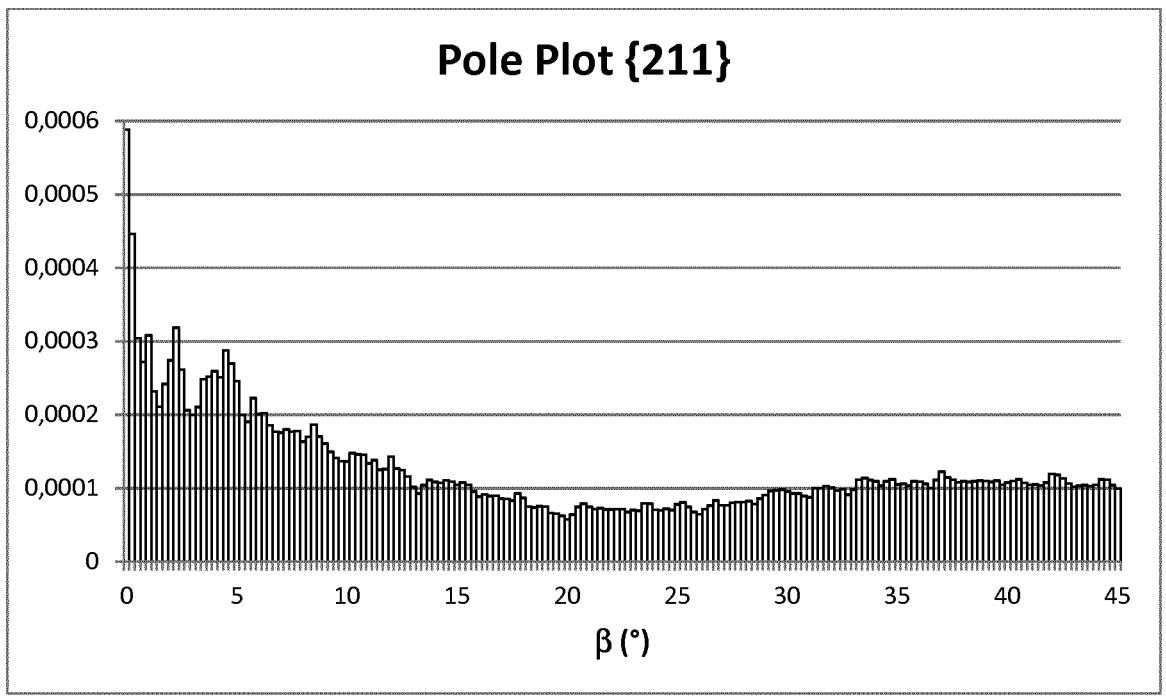
FIG. 3 {211} pole plot from the EBSD pole figure data of coating C01 with a bin size of 0.25° over a tilt angle range of 0°≤β≤45°.
Figure 4:
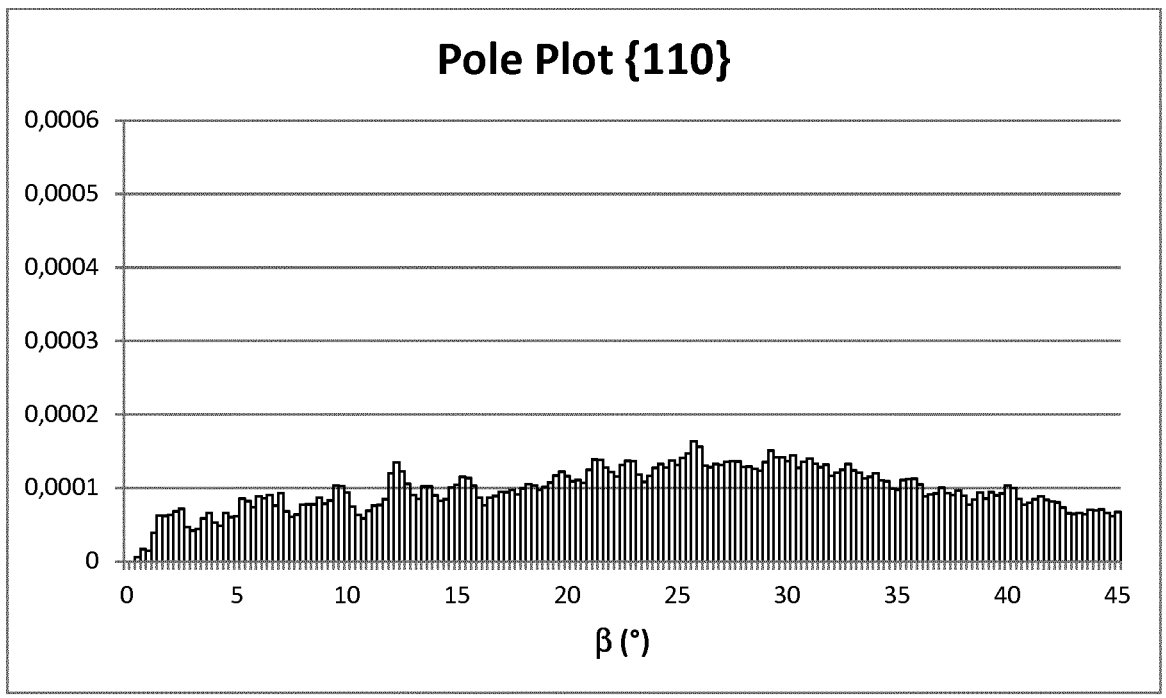
FIG. 4 {110} pole plot from the EBSD pole figure data of coating C01 with a bin size of 0.25° over a tilt angle range of 0°≤β≤45°.
Figure 6:
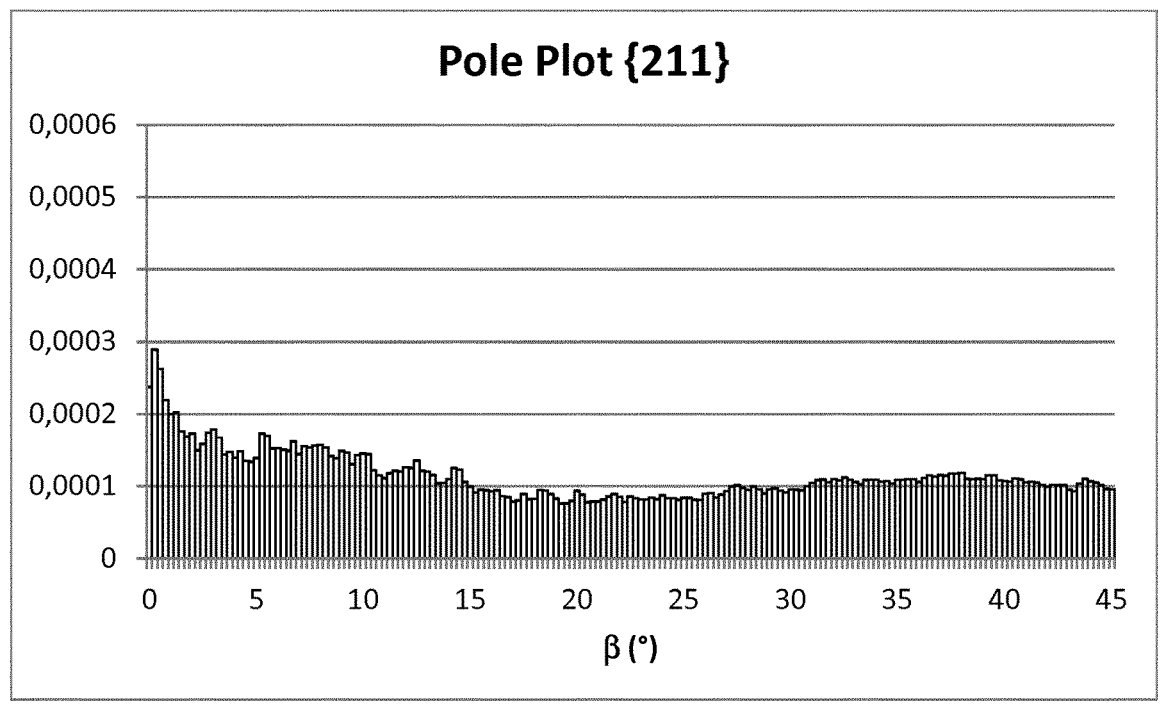
FIG. 6 {211} pole plot from the EBSD pole figure data of coating C06 with a bin size of 0.25° over a tilt angle range of 0°≤β≤45°.
Figure 7:
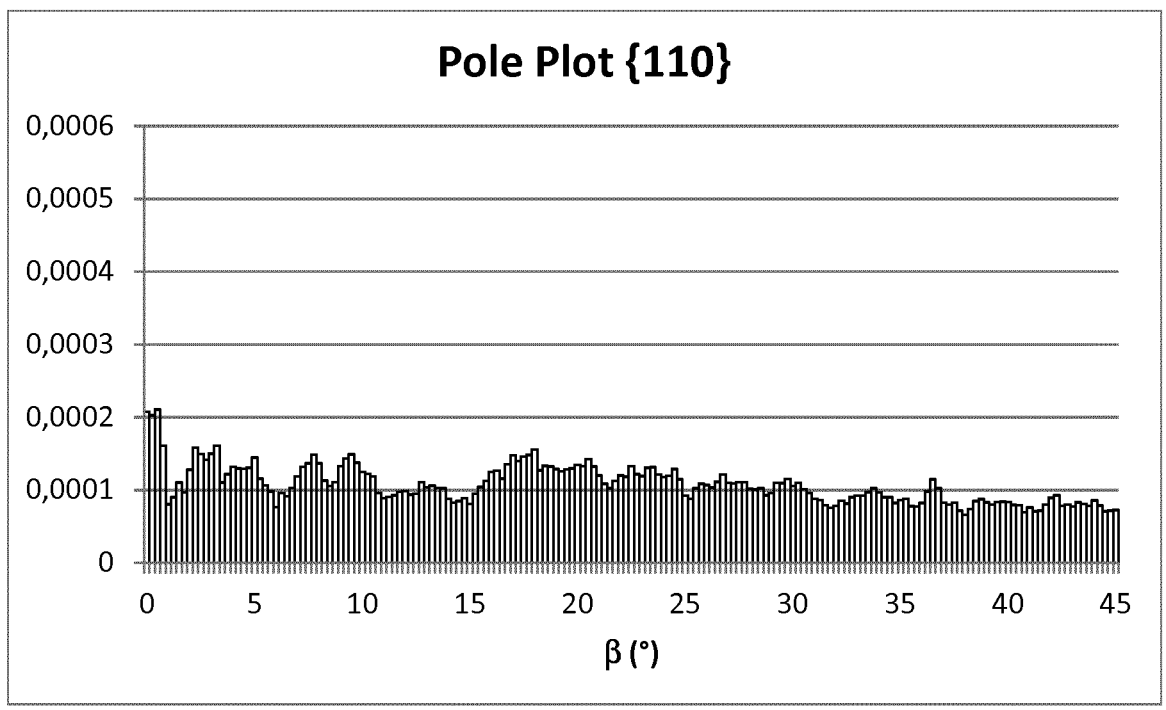
FIG. 7 {110} pole plot from the EBSD pole figure data of coating C06 with a bin size of 0.25° over a tilt angle range of 0°≤β≤45°.

Crystallographic orientation data extraction of the acquired EBSD data was made using Oxford Instruments "HKL Tango" software version 5.12.60.0 (64-bit) and Oxford Instruments "HKL Mambo" software version 5.12.60.0 (64-bit). Pole figures using equal area projection and upper hemisphere projection were retrieved from the acquired EBSD data using the "HKL Mambo" software. The retrieved pole figures were for both the {211} and {110} poles with the Z direction being perpendicular to the outer surface of the coatings. Pole plots of both the {211} and {110} pole figures were extracted using a class width of 0.25° for the bin size in the pole plot and for an angular measuring range β from β=0° to β≤45°. The intensity in the pole plot ranging from β=0 to β≤15° was related to the total intensity in the pole plot ranging from β=0° to β≤45°. The pole plots of {211} and {110} of coating C01 are shown in FIG. 3 and FIG. 4, respectively. The pole plots of {211} and {110} of coating C06 are shown in FIG. 6 and FIG. 7, respectively. The signal in the pole plot ranging from β=0 to β≤15° related to the total signal in the pole plot ranging from β=0° to β≤45° for the coatings C01, C02, C03, C04 and C06 are presented in Table 6.

TABLE 6

EBSD data

| Coating | Ratio of intensity within β = 0°-15° to intensity within β = 0°-45° in pole plot {211} [%] | Ratio of intensity within β = 0°-15° to intensity within β = 0°-45° in pole plot {110} [%] |
|---|---|---|
| C01 | 51 | 25 |
| C02 | 43 | 32 |
| C03 | 55 | 14 |
| C04 | 43 | 32 |
| C06 | 43 | 37 |

Figure 2:
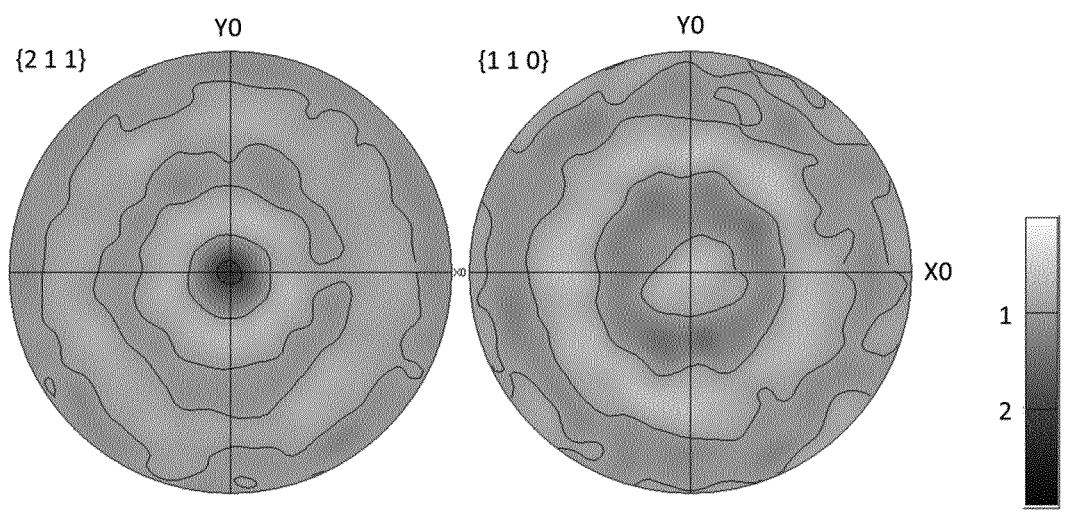
FIG. 2 Contoured versions of pole figures {211} and {110} from the coating C01, The maximum intensity is set to 3 as indicated by the label.
Figure 5:
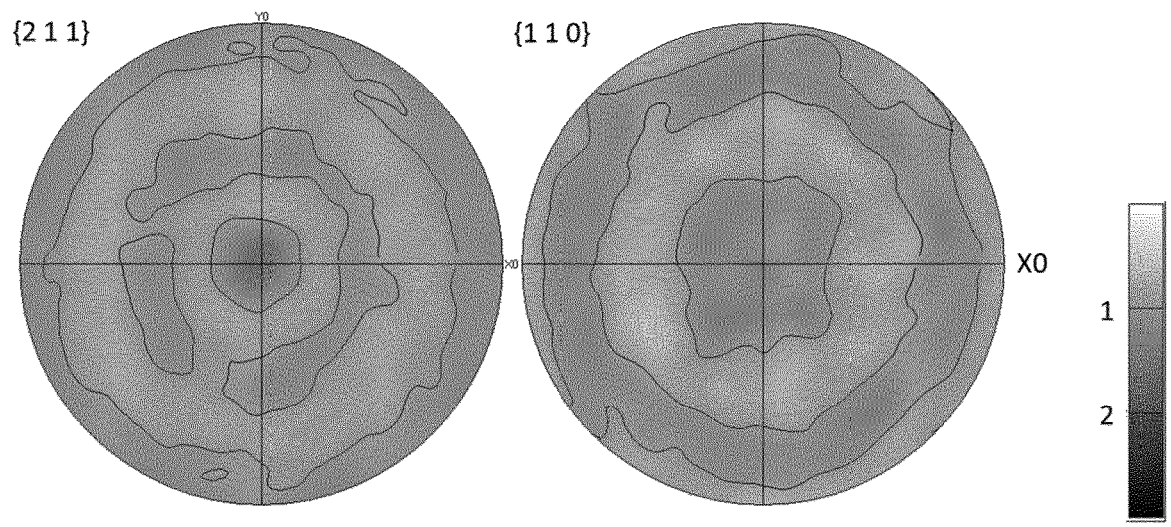
FIG. 5 Contoured versions of pole figures {211} and {110} from the coating C06. The maximum intensity is set to 3 as indicated by the label.

Contoured versions of the pole figures were calculated using a half width of 10.0° and a data clustering of 5.0° to illustrate the texture. The contoured pole figures {211} and {110} of coating C01 are shown in FIG. 2 and of coating C06 in FIG. 5. The maximum so called global intensity is set to 3MUD in these contoured versions of the pole figures.

Example 3—Cutting Tests

Prior to cutting wear tests the inserts were blasted on the rake faces in a wet blasting equipment using a slurry of alumina in water and the angle between the rake face of the cutting insert and the direction of the blaster slurry was about 90°. The alumina grits were F220, the pressure of slurry to the gun was 1.8 bar, the pressure of air to the gun was 2.0 bar, the average time for blasting per area unit was 5 seconds and the distance from the gun nozzle to the surface of the insert was about 137 mm. The aim of the blasting is to influence the residual stress in the coating and the surface roughness and thereby improve the properties of the inserts in the subsequent wear test.

The coatings C01-C05 were evaluated in five separate cutting tests.

Cutting Test 1

This test is to evaluate the resistance against crater wear at the rake face of the cutting tool. In the crater wear test the coatings C01-C05 were deposited on a cemented carbide substrate with a composition of about 9.14 wt % Co, 1.15 wt % Ta, 0.27 wt % Nb, 5.55 wt % C and the rest W.

The coated cutting tools of type Coromant R39011-T308M-PM as blasted were tested in down milling in the work piece material Toolox 33 using the following cutting data:
Cutting speed $v_c$: 300 m/min
Cutting feed per tooth, $f_z$: 0.2 mm/tooth
Axial depth of cut, $a_p$: 2 mm
Radial depth of cut, $a_e$: 50 mm
Number of teeth, z: 1
No cutting fluid was used.

In analyzing the crater wear, the area of exposed substrate was measured, using a light optical microscope. The wear of each cutting tool was evaluated after 4 cuts, i.e. 8 minutes cutting. Three parallel tests were run for each type of coating and the average values of the results are shown in Table 7.
Cutting Test 2

This is a test to evaluate the resistance towards chippings in the edge line. In the edge line toughness wear test the coatings C01-C05 were deposited on a cemented carbide substrate with a composition of about 13.5 wt % Co, 0.57 wt % Cr, 5.19 wt % C, and the rest W.

The coated cutting tools of the type Coromant R39011-T308M-PM as blasted were tested in number of cut entrances into work piece material Dievar unhardened using the following cutting data:
Cutting speed $v_c$: 150 m/min
Cutting feed per tooth, $f_z$: 0.15 mm/tooth
Axial depth of cut, $a_p$: 3 mm
Radial depth of cut, $a_e$: 12 mm
Number of teeth, z: 1
Length of cut: 12 mm
No cutting fluid was used.

In analyzing the edge line toughness, the number of entrances until the cut-off criterion was reached was studied. The cut-off criterion in the test was a chipping of at least 0.5 mm of the edge line or a measured depth of 0.2 at either the flank or the rake face. The chipping was studied using a light optical microscope. Between eight and ten parallel tests were run for each type of coating. The results are shown in Table 7 as an average value.
Cutting Test 3

In the plastic deformation resistance wear test the resistance against plastic deformation of the cutting edge when the cutting edge is impressed is evaluated. The coatings C01-C05 were deposited on a cemented carbide substrate with a composition of about 9.14 wt % Co, 1.15 wt % Ta, 0.27 wt % Nb, 5.55 wt % C and the rest W.

The coated cutting tools of type Coromant R39011-T308M-PM as blasted were tested in down milling in the work piece material Toolox 33 using the following cutting data:
Cutting speed $v_c$: 300 m/min
Cutting feed per tooth, $f_z$: 0.15 mm/revolution
Axial depth of cut, $a_p$: 1.5 mm
Radial depth of cut, $a_e$: 75 mm
Number of teeth, z: 1
No cutting fluid was used.

In analyzing the resistance against plastic deformation at edge line impression, the area of exposed substrate was measured, using a light optical microscope. The tool life criterion is set to when the width of the exposed substrate is ≥0.2 mm. Three parallel tests were run for each type of coating. The average values of the results are shown in Table 7.
Cutting Test 4

The thermal crack resistance test is a test of the resistance against the formation of thermal cracks and chipping as a consequence of these cracks. In this test the coatings C01-C05 were deposited on a cemented carbide substrate with a composition of about 13.5 wt % Co, 0.57 wt % Cr, 5.19 wt % C, and the rest W.

The coated cutting tools of type Coromant R39011-T308M-PM as blasted were tested in up milling in the work piece material Toolox 33 using the following cutting data:
Cutting speed $v_c$: 250 m/min
Cutting feed per tooth, $f_z$: 0.2 mm/revolution
Axial depth of cut, $a_p$: 3 mm
Radial depth of cut, $a_e$: 40 mm
Number of teeth, z: 1
Cutting fluid was used.

In analyzing the wear, the chipping of the coating was studied using a light optical microscope. The life time criterion was set to a chipping depth of ≥0.3 mm or chipping width of ≥1.0 mm. Between 2 and 5 parallel tests were run for each type of coating. The results are shown as an average value in Table 7.
Cutting Test 5

This test evaluates the resistance to thermal cracks in dry machining. When thermal cracks have formed, the edge will suffer from plastic deformation. In this wear test the coatings C01-C05 were deposited on a cemented carbide substrate with a composition of about 9.14 wt % Co, 1.15 wt % Ta, 0.27 wt % Nb, 5.55 wt % C and the rest W.

The coated cutting tools of the type Coromant R245-12T3M-PM as blasted were tested in down milling in the work piece material Toolox 33 using the following cutting data:
Cutting speed $v_c$: 300 m/min
Cutting feed per tooth, $f_z$: 0.46 mm/tooth
Axial depth of cut, $a_p$: 2 mm
Radial depth of cut, $a_e$: 20 mm
Number of teeth, z: 1
No cutting fluid was used.

In analyzing the crater wear, the area of exposed substrate was measured, using a light optical microscope. The tool life criterion was set to a width of exposed substrate exceeding 0.25 mm. Two parallel tests were run for each type of coating. The average value results are shown in Table 7.

TABLE 7

Results of cutting tests

| Coating: | 1 Crater area [mm²] | 2 Edge line toghness [no. of cuts] | 3 Plastic deformation resistance-impression [minutes] | 4 Thermal crack resistance wet [minutes] | 5 Thermal crack resistance dry [minutes] |
| --- | --- | --- | --- | --- | --- |
| C01 | 0.06 | 44.5 | 32.6 | 9.4 | 45.2 |
| C02 | 0.1 | 33.3 | 24.6 | 7 | 36.9 |
| C03 | 0.07 | 38.9 | 27.9 | 8.8 | 38.4 |
| C04 | 0.08 | 31.5 | 32.2 | 9.2 | 39.1 |
| C05 | 0.17 | 13.3 | 14 | 5.9 | 27 |

It can be concluded that the C01 is the overall best performing coating. A selection of specific thicknesses and orientations of the layers of the coating gives an unexpected optimum in properties. The inventive coated cutting tool performs best in a wide spectrum of demanding metal cutting applications.

While the invention has been described in connection with various exemplary embodiments, it is to be understood that the invention is not to be limited to the disclosed exemplary embodiments; on the contrary, it is intended to cover various modifications and equivalent arrangements within the appended claims.

The invention claimed is:

1. A coated cutting tool comprising:
a substrate coated with a coating including a layer of α-Al$_2$O$_3$, wherein a thickness of the α-Al$_2$O$_3$ layer is 2-4 μm and wherein said α-Al$_2$O$_3$ layer exhibits a texture coefficient TC(hkl), as measured by X-ray diffraction using CuKa radiation and θ-2θ scan, defined according to Harris formula $$TC(hkl) = \frac{I(hkl)}{I_0(hkl)} \left[ \frac{1}{n} \sum_{n=1}^{n} \frac{I(hkl)}{I_0(hkl)} \right]^{-1}$$

where I(hkl) is the measured intensity (integrated area) of the (hkl) reflection, I$_0$(hkl) is the standard intensity according to ICDD's PDF-card No. 00-010-0173, n is the number of reflections used in the calculation, and where the (hkl) reflections used are (1 0 4), (1 1 0), (1 1 3), (0 2 4), (1 1 6), (2 1 4), (3 0 0) and (0 0 12), wherein TC(0 0 12) ≥7.2, and wherein the ratio of I(0 0 12)/I(0 1 14) ≤0.8, and wherein said coating further includes a MTCVD TiCN layer located between the substrate and the α-Al$_2$O$_3$ layer, wherein the thickness of said MTCVD TiCN layer is 2-3 μm and wherein said MTCVD TiCN layer exhibits a {211} pole figure as measured by EBSD in a portion of the MTCVD TiCN layer parallel to an outer surface of the coating and less than 1 μm from an outer surface of the MTCVD TiCN, wherein a pole plot based on the data of the pole figure, with a bin size of 0.25° over a tilt angle range of 0°≤β≤45° from the normal of the outer surface of the coating shows a ratio of intensity within β≤15° tilt angle to the intensity within 0°≤β≤45° of ≥45%.

2. The coated cutting tool in accordance with claim 1, wherein said MTCVD TiCN layer exhibits a {110}pole figure as measured by EBSD, wherein a pole plot based on the data of the pole figure, with a bin size of 0.25° over a tilt angle range of 0°≤β≤45° from a normal of the outer surface of the coating shows a ratio of intensity within β≤15° tilt angle to the intensity within 0°≤β≤45° of ≤30%.

3. The coated cutting tool in accordance with claim 1, wherein the thickness of the β-Al$_2$O$_3$ layer is 2.5-3.5 μm.

4. The coated cutting tool in accordance with claim 1, wherein the coating further includes a bonding layer having a HTCVD deposited TiN, TiCN, TiCNO and/or TiCO or a combination thereof, the bonding layer being located outermost of the MTCVD TiCN layer and adjacent to the β-Al$_2$O$_3$ layer.

5. The coated cutting tool in accordance with claim 4, wherein the thickness of the bonding layer is 0.5-1 μm.

6. The coated cutting tool in accordance with claim 1, further comprising an innermost TiN layer adjacent to the substrate.

7. The coated cutting tool in accordance with claim 6, wherein the thickness of said innermost TiN layer is 0.3-0.6 μm.

8. The coated cutting tool in accordance with claim 1, wherein the substrate is cemented carbide, cermet, ceramic.

9. The coated cutting tool in accordance with claim 1, wherein the substrate is cemented carbide with a Co content of 8-15 wt %.

10. The coated cutting tool in accordance with claim 1, wherein the cutting tool is a milling insert.

* * * * *